(12) United States Patent
Mondal et al.

(10) Patent No.: US 7,167,115 B1
(45) Date of Patent: Jan. 23, 2007

(54) METHOD, APPARATUS, AND COMPUTER-READABLE MEDIUM FOR DATA COMPRESSION AND DECOMPRESSION UTILIZING MULTIPLE DICTIONARIES

(75) Inventors: Umasankar Mondal, Snellville, GA (US); Dingguo Zou, Duluth, GA (US)

(73) Assignee: American Megatrends, Inc., Norcross, GA (US)

( * ) Notice: Subject to any disclaimer, the term of this patent is extended or adjusted under 35 U.S.C. 154(b) by 0 days.

(21) Appl. No.: 11/212,158

(22) Filed: Aug. 26, 2005

(51) Int. Cl.
    *H03M 7/30* (2006.01)
(52) U.S. Cl. .......................................... 341/87; 341/51
(58) Field of Classification Search .................. 341/51, 341/87, 106
    See application file for complete search history.

(56) References Cited

U.S. PATENT DOCUMENTS

| | | | | |
|---|---|---|---|---|
| 4,122,440 A | 10/1978 | Langdon, Jr. et al. | 340/347 DD |
| 4,464,650 A | 8/1984 | Eastman et al. | 340/347 DD |
| 4,558,302 A | 12/1985 | Welch | 340/347 DD |
| 4,814,746 A | 3/1989 | Miller et al. | 341/95 |
| 4,876,541 A | 10/1989 | Storer | 341/51 |
| 5,153,591 A | 10/1992 | Clark | 341/51 |
| 5,389,922 A | 2/1995 | Seroussi et al. | 341/51 |
| 5,406,281 A * | 4/1995 | Klayman | 341/51 |
| 5,673,209 A | 9/1997 | Heiney et al. | 364/715.02 |
| 5,861,827 A | 1/1999 | Welch et al. | 341/51 |
| 6,208,273 B1 * | 3/2001 | Dye et al. | 341/51 |
| 6,320,523 B1 | 11/2001 | York et al. | 341/106 |
| 6,426,711 B1 | 7/2002 | Cooper | 341/87 |
| 6,606,040 B2 | 8/2003 | Abdat | 341/87 |
| 6,614,368 B1 * | 9/2003 | Cooper | 341/51 |
| 6,624,762 B1 | 9/2003 | End, III | 341/51 |
| 6,628,211 B1 * | 9/2003 | Cooper | 341/50 |
| 6,700,512 B2 | 3/2004 | Abdat | 341/87 |
| 6,707,400 B2 | 3/2004 | Christofferson et al. | 341/106 |
| 6,762,699 B1 | 7/2004 | Yang | 341/51 |
| 2003/0102988 A1 * | 6/2003 | Cooper | 341/51 |

OTHER PUBLICATIONS

Cleary, John G. and Witten, Ian H., "Data Compression Using Adaptive Coding and Partial String Matching," IEEE Transactions on Communications, vol. Com-32, No. 4, 32(4):396-402 (Apr. 1984).

Huffman, David A., "A Method for Construction of Minimum-Redundancy Codes," Proceedings of the I.R.E., 1098-1101 (Sep. 1952).

(Continued)

*Primary Examiner*—Howard L. Williams
(74) *Attorney, Agent, or Firm*—Hope Baldauff Hartman, LLC (57) ABSTRACT

A method, apparatus, and computer-readable medium for compressing and decompressing an input data stream utilizing multiple dictionaries is provided. According the method for compressing data, a string and a character are read from the input data stream. A determination is made as to whether the string plus character are contained in a first or second dictionary. If the string plus character is in either dictionary, a next character is added to the string. If the string plus character is not in either dictionary, a code or character is output. A determination is then made as to whether the input word and string is a two character word. If so, a new code is added to the first dictionary corresponding to the two character word. Otherwise, a new code is added to the second dictionary for the string and character.

19 Claims, 6 Drawing Sheets

OTHER PUBLICATIONS

Nelson, Mark, "LZW Data Compression," Dr. Dobb's Journal (Oct. 1989).

Weinberger, Marcelo J. and Lempel, Abraham and Ziv, Jacob, "A Sequential Algorithm for the Universal Coding of Finite Memory Sources," IEEE Transactions on Information Theory, vol. 38, No. 3, 1002-1014 (May 1992).

Ziv, Jacob and Lempel, Abraham, "Compression of Individual Sequences Via Variable-Rate Coding," IEEE Transactions on Information Theory, vol. IT-24, No. 5, 530-536 (Sep. 1978).

Ziv, Jacob and Lempel, Abraham, "A Universal Algorithm for Sequential Data Compression," IEEE Transactions on Information Theory, vol. IT-23, No. 3, 337-343 (May 1977).

* cited by examiner

METHOD, APPARATUS, AND COMPUTER-READABLE MEDIUM FOR DATA COMPRESSION AND DECOMPRESSION UTILIZING MULTIPLE DICTIONARIES

TECHNICAL FIELD

The present invention is related to video compression in a computer network. More particularly, the present invention is related to compressing an input data stream utilizing multiple dictionaries.

BACKGROUND OF THE INVENTION

Computer networks generally include a plurality of interconnected computer systems. Some computer networks utilize a local computer for communicating data to one or more remote computers that are connected to the local computer through the network. From the remote computer, users may control or view activity on a local computer over the network utilizing a hardware interface device connected to the local computer. For instance, utilizing the interface device, a user may view screens of video data on the remote computer that were generated by the local computer. Each screen of video data may comprise thousands or millions of pixels, with each pixel representing a single point in a graphic image. Each point or pixel in a graphic image is represented by a predetermined number of bits based on the number of colors that are displayed on a graphics display.

Since a single screen comprising a graphics image may comprise millions of bits of video data, the video data must be compressed before being communicated between computers in a network. Compression enables the communication of video data in fewer bits (and in less time) than if the video data was communicated in its raw form. Typically, compression of video data involves compressing the pixel values that make up the frames of video data utilizing a compression algorithm. Many current compression algorithms are variants of the well known Lempel, Ziv, Welch ("LZW") compression algorithm. The LZW algorithm automatically builds a dictionary of string patterns encountered in the data stream to be compressed. The dictionary does not need to be transmitted with the compressed data stream because the decompressor can build the dictionary in the same way that the compressor does.

Current video data compression algorithms based on the LZW process suffer from a number of drawbacks. One drawback results from the fact that the LZW algorithm utilizes only a single dictionary for storing previously encountered strings. Each string is represented in the dictionary by a word constructed from a code and a character. Therefore, assuming the code is X bits and the character is eight bits, then a given dictionary requires $2^{(X+8)}$ address locations. For instance, a dictionary utilizing an 11 bit code requires $2^{19}$ address locations (512K addresses). Because two bytes must be utilized to store each word, the size of the dictionary in this example is one megabyte (2*512K). Therefore, the dictionary size for a single dictionary capable of storing 2K items is one megabyte. The first 256 entries are reserved for single characters. The remaining entries can be utilized for storing compound words, which are words with two or more characters. As a result, a dictionary with 2K items can store 2K–256 compound words.

If the memory available in the computer system performing the decompression is exactly 512K, 1 MB, 2 MB, 4 MB, 8 MB, etc., then utilizing a single dictionary works well. However, in many cases additional memory may be available that is less than required to support codes having an additional bit. For instance, 3 MB may be available. This amount of memory is sufficient to support a dictionary having 4K codes (2 MB), but not a dictionary having 8K codes (4 MB). However, previous variants on the LZW algorithm are unable to effectively make use of the additional memory.

Another drawback to previous variants of the LZW algorithm is that compression and decompression can often be slow utilizing these algorithms. One reason for the poor performance is that a search must be made of the dictionary during each iteration to determine whether a matching string is in the dictionary. If a matching string is found, the code for the string is output. If a matching string is not found, then a new code is added to the dictionary for the current string. However, searching a large dictionary can be a time consuming process. Accordingly, it is desirable to reduce the number of times that the dictionary must be searched.

It is with respect to these considerations and others that the present invention has been made.

SUMMARY OF THE INVENTION

In accordance with the present invention, the above and other problems are solved by providing a method, computer-readable medium, and apparatus for encoding and decoding data utilizing multiple dictionaries. By using a separate dictionary corresponding only to the two character words in an input stream, the characters can be output directly from the code and the dictionary lookup can be avoided. Moreover, by utilizing multiple dictionaries, more effective use can be made of different memory sizes.

According to one aspect of the invention, a method is provided for compressing an input data stream. According to aspects of the invention, the input data stream may comprise video data to be compressed and transmitted to a remote computer system for decompression. In order to compress the input data stream, a string and a character are read from the input stream. Initially, the string comprises a single character. A determination is then made as to whether a code corresponding to the string plus the character is contained in a first dictionary or a second dictionary. According to embodiments, the first dictionary is utilized to store only codes corresponding to two character words. A second dictionary is also utilized to store only codes corresponding to words having three or more characters.

If a code corresponding to the input word is in the first or second dictionaries, the character is appended to the string and another character is read from the input data stream. The determination as to whether the string and character are contained in the first or second dictionaries is then repeated. If the code is not in the first or second dictionaries, a determination is made as to whether the string plus the character comprises only one character. If so, the character is output. If not, a code is output for the string. A determination is then made as to whether the string and character corresponds to a two character word. If the string and character corresponds to a two character word, a new code is created in the first dictionary corresponding to the two character word. Otherwise, a new code is created in the second dictionary corresponding to the string and character. The string is then assigned the value of the character and the process repeats until no additional input remains to compress the entire data stream.

According to other aspects of the method, a simplified mechanism is provided for generating a memory address for entries in the dictionaries. According to this aspect, a memory address may be formed directly from the string and the appended character. In this embodiment, the character is appended to the code and the result is utilized to directly access the contents of the dictionary.

According to another embodiment of the invention, a method is provided for decompressing a data stream that has been compressed utilizing multiple dictionaries. According to this embodiment, a character or a code is read from an input data stream. If the read input comprises a character, the character is output. If the read input comprises a code corresponding to a two character word, the two characters are directly output utilizing the code without performing a lookup operation. If the read input does not comprise a code corresponding to a character or a two character word, one or more lookup operations are performed to identify an output string. The output string is then output.

According to other aspects of the method for decompression, a determination may also be made as to whether a previous code and the first character of the output string together form a new two character word. If so, a new entry is created in a table corresponding to the previous code and first character of the output string. In this manner, the table may be utilized to store codes corresponding to two character words. If the previous code and first character of the output string do not form a two character word, a new entry is created in the table. In this manner, the table may also be utilized to store codes corresponding to words having three or more characters. A flag in the table is utilized to distinguish entries for two character words from entries for words having three or more characters.

The above-described aspects of the invention may also be implemented as a computer-controlled apparatus, a computer process, a computing system, an apparatus, such as a field-programmable gate array ("FPGA"), or as an article of manufacture such as a computer program product or computer-readable medium. The computer program product may be a computer storage media readable by a computer system and encoding a computer program of instructions for executing a computer process. The computer program product may also be a propagated signal on a carrier readable by a computing system and encoding a computer program of instructions for executing a computer process.

These and various other features as well as advantages, which characterize the present invention, will be apparent from a reading of the following detailed description and a review of the associated drawings.

DETAILED DESCRIPTION OF THE INVENTION

Embodiments of the present invention provide methods, systems, apparatus, and computer-readable media for compressing and decompressing data utilizing multiple dictionaries. In the following detailed description, references are made to the accompanying drawings that form a part hereof, and in which are shown by way of illustration specific embodiments or examples. Referring now to the drawings, in which like numerals represent like elements through the several figures, aspects of the present invention and the exemplary operating environment will be described.

Figure 1:
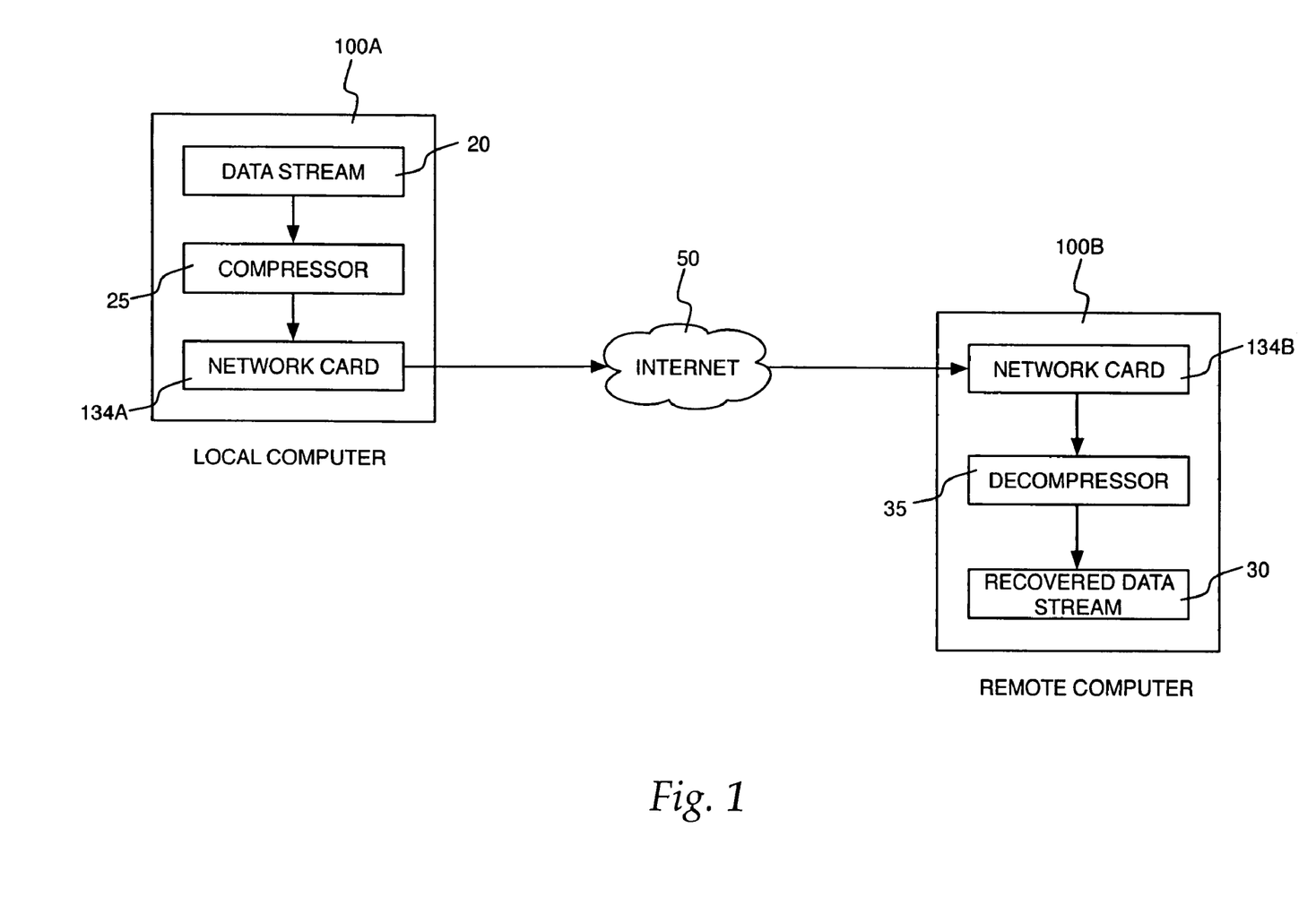
FIG. 1 is a network diagram showing aspects of several computers utilized in the various embodiments of the invention.

FIG. 1 and the following discussion are intended to provide a brief, general description of a suitable computing environment in which the invention may be implemented. While the invention will be described in the general context of program modules that execute in conjunction with an application program that runs on an operating system on a computer system, those skilled in the art will recognize that the invention may also be implemented in combination with other program modules.

Generally, program modules include routines, programs, components, data structures, and other types of structures that perform particular tasks or implement particular abstract data types. Moreover, those skilled in the art will appreciate that the invention may be practiced with other computer system configurations, including hand-held devices, multi-processor systems, microprocessor-based or programmable consumer electronics, minicomputers, mainframe computers, and the like. The invention may also be practiced in distributed computing environments where tasks are performed by remote processing devices that are linked through a communications network. In a distributed computing environment, program modules may be located in both local and remote memory storage devices.

Turning now to FIG. 1, an illustrative operating environment for embodiments of the invention will be described. As shown in FIG. 1, a computer 100A is connected to the internet 50, or other type of local or distributed network, via a network card 134A. Another computer 100B is also connected to the same network via a network card 134B. Each of the computers may comprise a standard desktop or server computer, or may comprise another type of computing device such as a hand-held computer, an embedded computer system, or other type of computing device.

Figure 3:
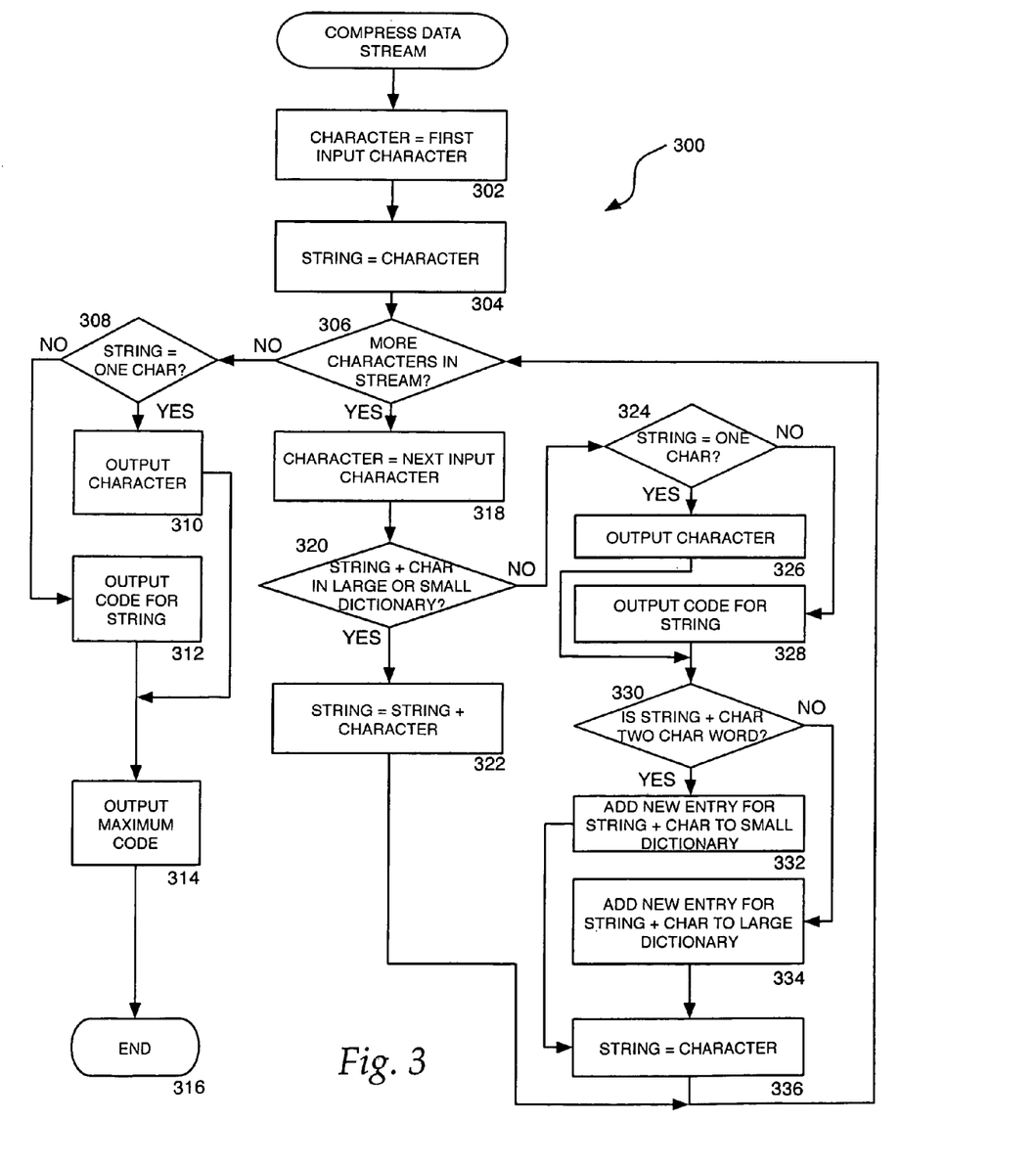
FIG. 3 is a flow diagram illustrating aspects of a method for compressing an input stream in one embodiment of the invention.
Figure 4:
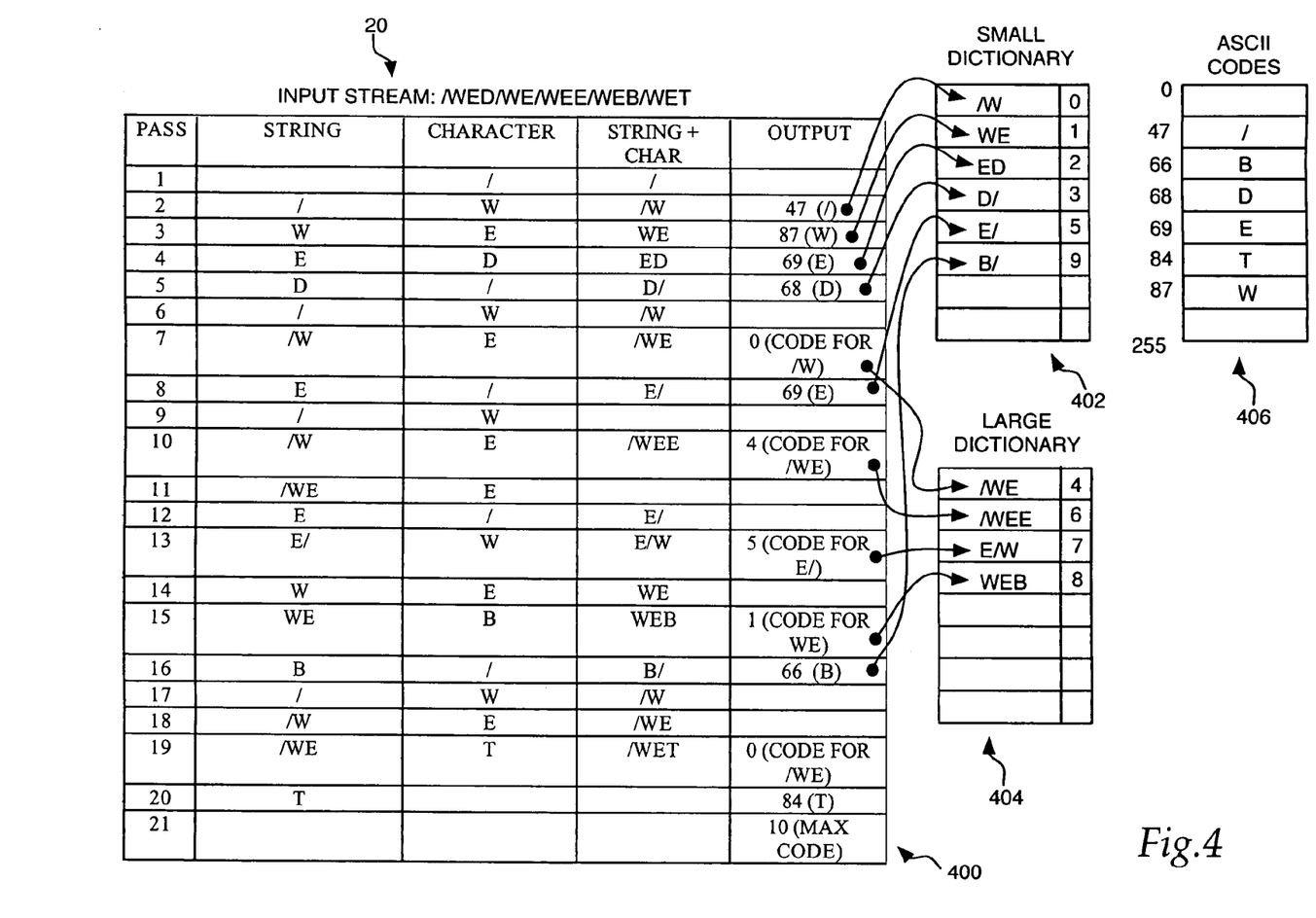
FIG. 4 is a block diagram illustrating the contents of small dictionary and a big dictionary constructed in an embodiment of the invention to compress a sample input stream in one embodiment of the invention.

According to embodiments of the invention, the computer 100A is operative to execute a compressor 25. The compressor 25 comprises a software application that is operative to receive a data stream 20 and to compress the contents of the data stream for transmission to another computer. The data stream 20 may comprise any type of data, including text, binary data, video data, sound data, or other types of data. FIGS. 3 and 4, described below, provide additional detail regarding the operation of the compressor 25.

According to aspects of the invention, the computer 100B is operative to receive the compressed data stream generated by the computer 100A via the internet 50. The compressed data stream is read by a decompressor 35. The decompressor 35 comprises a software application operative to receive the compressed data stream from the compressor 25 and to decompress the data into a recovered data stream 30. It should be appreciated that, through the process of compression and decompression, the data stream 20 is recreated at the computer 100B in the form of the recovered data stream 30. It should also be appreciated that as a result of the compression performed by the compressor 25, the size of the data transmitted to the computer 100B is less than the size of the original data stream 20. It should also be appreciated that the compressor 25 and the decompressor 35 may be embodied in firmware or in a hardware device. Additional details regarding the operation of the decompressor 35 are provided below with respect to FIGS. 5 and 6.

Figure 2:
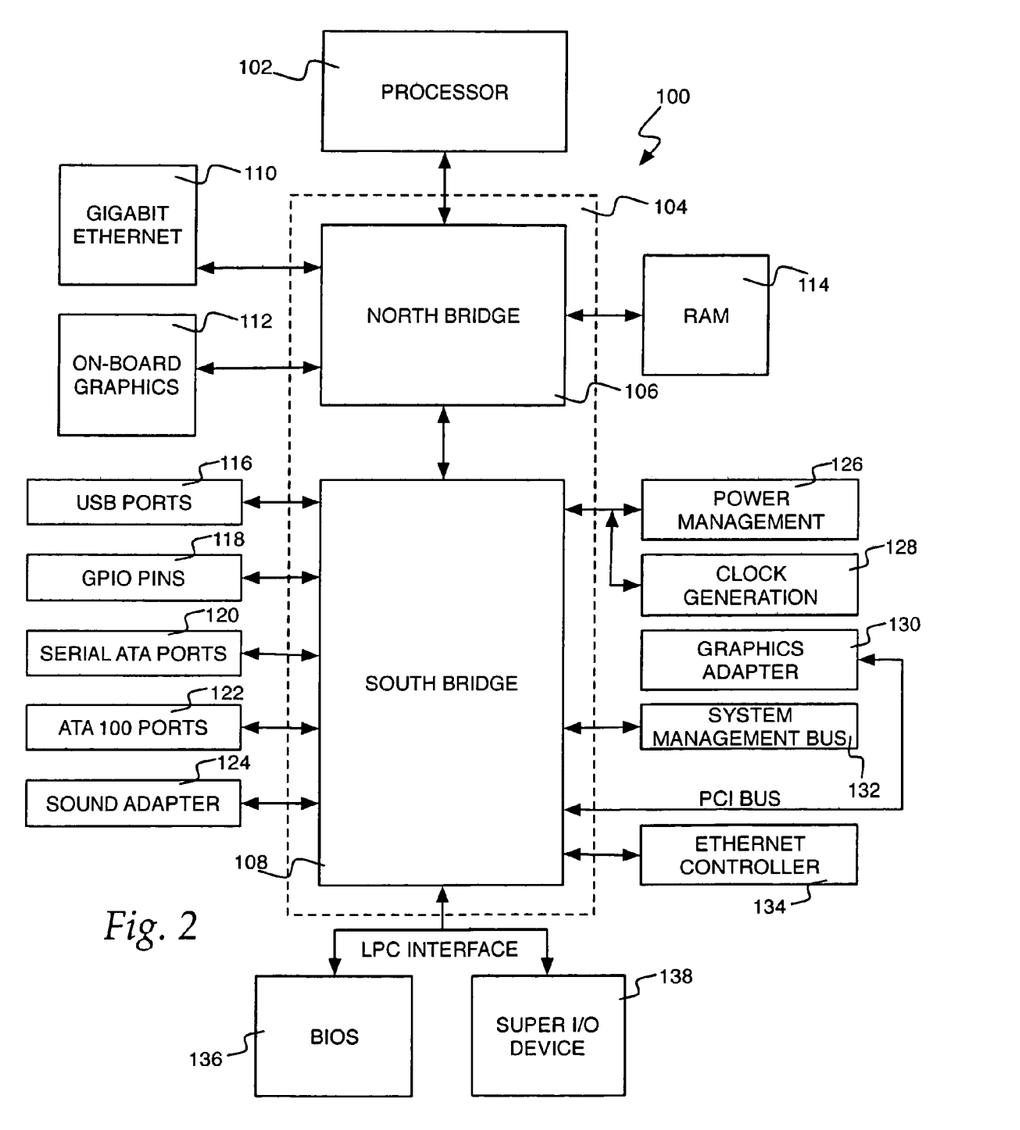
FIG. 2 is a computer architecture diagram showing aspects of a computer utilized in the various embodiments of the invention.

Referring now to FIG. 2, an illustrative computer architecture for practicing the embodiments of the present invention will be described. It should be appreciated that although the embodiments of the invention described herein are discussed in the context of a conventional desktop or server computer, the embodiments of the invention may be utilized with virtually any type of computing device. FIG. 2 shows an illustrative computer architecture for a computer 100 that is operative to compress a data stream 20 and to decompress a compressed data stream provided by the compressor. It should be appreciated that the compressor 25 may be executed on a first computer and that the decompressor 35 may be executed on a second computer.

In order to provide the functionality described herein, the computer 100 includes a baseboard, or "motherboard", which is a printed circuit board to which a multitude of components or devices may be connected by way of a system bus or other electrical communication path. In one illustrative embodiment, a central processing unit ("CPU") 102 operates in conjunction with a chipset 104. The CPU 102 is a standard central processor that performs arithmetic and logical operations necessary for the operation of the computer.

The chipset 104 includes a north bridge 106 and a south bridge 108. The north bridge 106 provides an interface between the CPU 102 and the remainder of the computer 100. The north bridge 106 also provides an interface to the random access memory ("RAM") 114 and, possibly, an on-board graphics adapter 112. The north bridge 106 may also include functionality for providing networking functionality through a gigabit Ethernet adapter 110. The gigabit Ethernet adapter 110 is capable of connecting the computer 100 to another computer via a network. Connections which may be made by the network adapter 110 may include local area network ("LAN") or wide area network ("WAN") connections. LAN and WAN networking environments are commonplace in offices, enterprise-wide computer networks, intranets, and the Internet. The north bridge 106 is connected to the south bridge 108.

The south bridge 108 is responsible for controlling many of the input/output functions of the computer 100. In particular, the south bridge 108 may provide one or more universal serial bus ("USB") ports 116, a sound adapter 124, an Ethernet controller 134, and one or more general purpose input/output ("GPIO") pins 122. The south bridge 108 may also provide a bus for interfacing peripheral card devices such as a graphics adapter 130. In one embodiment, the bus comprises a peripheral component interconnect ("PCI") bus. The south bridge 108 may also provide a system management bus 132 for use in managing the various components of the computer 100. Power management circuitry 126 and clock generation circuitry 128 may also be utilized during the operation of the south bridge 108.

The south bridge 108 is also operative to provide one or more interfaces for connecting mass storage devices to the computer 100. For instance, according to an embodiment, the south bridge 108 includes a serial advanced technology attachment ("ATA") adapter for providing one or more serial ATA ports 120 and an ATA 100 adapter for providing one or more ATA 100 ports 122. The serial ATA ports 120 and the ATA 100 ports 122 may be, in turn, connected to one or more mass storage devices storing an operating system and application programs. As known to those skilled in the art, an operating system comprises a set of programs that control operations of a computer and allocation of resources. An application program is software that runs on top of the operating system software and uses computer resources made available through the operating system to perform application specific tasks desired by the user.

The mass storage devices connected to the south bridge 108, and its associated computer-readable media, provide non-volatile storage for the computer 100. Although the description of computer-readable media contained herein refers to a mass storage device, such as a hard disk or CD-ROM drive, it should be appreciated by those skilled in the art that computer-readable media can be any available media that can be accessed by the computer 100. By way of example, and not limitation, computer-readable media may comprise computer storage media and communication media. Computer storage media includes volatile and non-volatile, removable and non-removable media implemented in any method or technology for storage of information such as computer-readable instructions, data structures, program modules or other data. Computer storage media includes, but is not limited to, RAM, ROM, EPROM, EEPROM, flash memory or other solid state memory technology, CD-ROM, DVD, or other optical storage, magnetic cassettes, magnetic tape, magnetic disk storage or other magnetic storage devices, or any other medium which can be used to store the desired information and which can be accessed by the computer.

A low pin count ("LPC") interface may also be provided by the south bridge 108 for connecting a "Super I/O" device 138. The Super I/O device 138 is responsible for providing a number of input/output ports, including a keyboard port, a mouse port, a serial interface, a parallel port, and other types of input/output ports. The LPC interface may also connect a read-only memory ("ROM") device for storing a basic input/output system ("BIOS") 136 that includes program code containing the basic routines that help to start up the computer 100 and to transfer information between elements within the computer 100.

It should be appreciated that the computer 100 may comprise other types of computing devices, including handheld computers, embedded computer systems, personal digital assistants, and other types of computing devices known to those skilled in the art. It is also contemplated that the computer 100 may not include all of the components shown in FIG. 2, may include other components that are not explicitly shown in FIG. 2, or may utilize an architecture completely different than that shown in FIG. 2.

Figure 5:
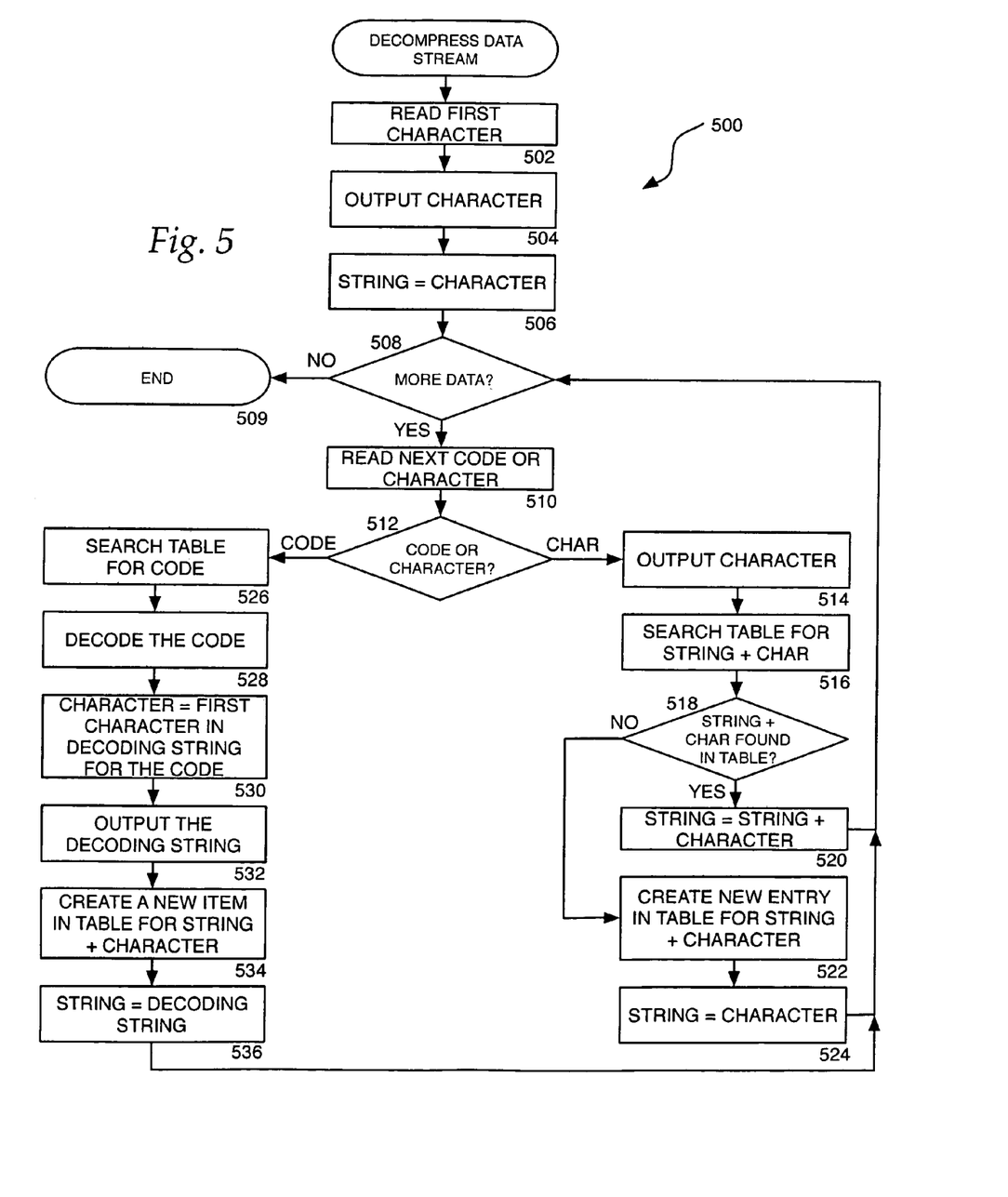
FIG. 5 is a flow diagram illustrating aspects of a method for decompressing a compressed data stream according to one embodiment of the invention.
Figure 6:
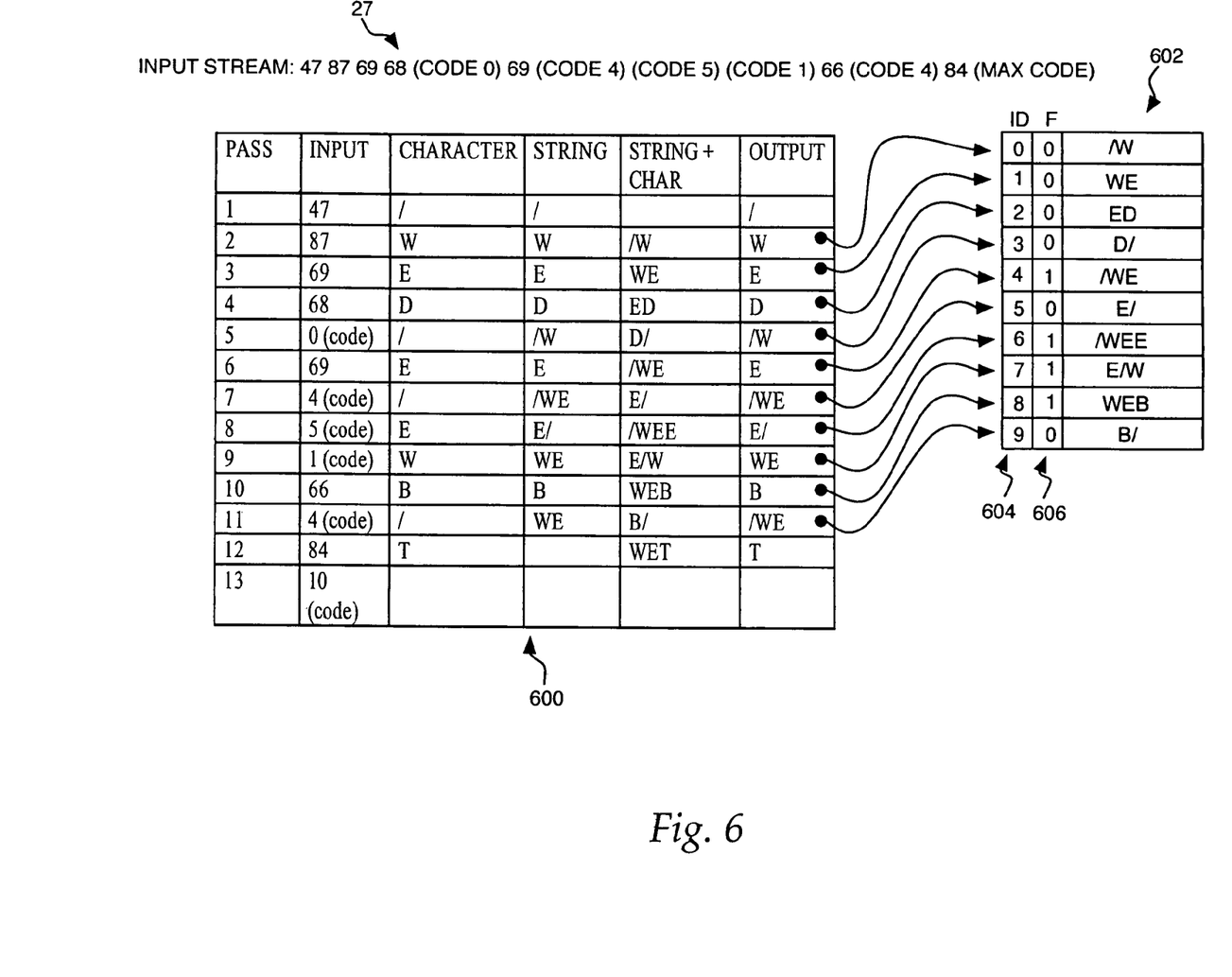
FIG. 6 is a block diagram illustrating the contents of a table constructed in an embodiment of the invention to decompress a compressed data stream in one embodiment of the invention.

According to embodiments of the invention, the mass storage devices connected to the computer 100 and the RAM 114 are operative to store a compressor 25 and a decompressor 35. The compressor 25 and decompressor 35 are executed by the CPU 102 to compress and decompress a data stream, respectively. FIGS. 3–4 provide additional details regarding the operation of the compressor 25 while FIGS. 5–6 provide additional details regarding the operation of the decompressor 35.

Turning now to FIG. 3, an illustrative routine 300 will be described illustrating the operation of the compressor 25 for compressing data according to one embodiment of the invention. It should be appreciated that the logical operations of the various embodiments of the present invention are implemented (1) as a sequence of computer implemented acts or program modules running on a computing system and/or (2) as interconnected machine logic circuits or circuit modules within the computing system. The implementation is a matter of choice dependent on the performance requirements of the computing system implementing the invention. Accordingly, the logical operations of FIGS. 3 and 5 and making up the embodiments of the present invention described herein are referred to variously as operations, structural devices, acts or modules. It will be recognized by one skilled in the art that these operations, structural devices, acts and modules may be implemented in software, in firmware, in special purpose digital logic, and any combination thereof without deviating from the spirit and scope of the present invention as recited within the claims attached hereto.

In order to more fully described the processing operations shown in FIG. 3, the routine 300 will be described in conjunction with FIG. 4. As will be described in greater detail below, the routine illustrated in FIG. 3 receives an input data stream and outputs a compressed version of the data stream. In order to perform this processing, the routine illustrated in FIG. 3 utilizes several variables. A string variable referred to herein as "STRING" is utilized to store a current string of characters from the input data stream. A string variable referred to herein as "CHARACTER" is utilized to store a current character from the input data stream.

According to embodiments of the invention, multiple dictionaries are also utilized to store codes corresponding to previously encountered strings of data in the input data stream. According to embodiments of the invention, a first dictionary 402 is utilized to store only codes corresponding to two character words. A second dictionary 402 is utilized to store only codes corresponding to words having three or more characters. Additionally, the first 255 codes are utilized for single character words. These codes may correspond to a table 404 storing ASCII codes for the single characters within the computer 100. FIG. 4 also shows an illustrative input data stream 20. The data stream 20 comprises the characters "/WED/WE/WEE/WEB/WET" and has been constructed to illustrate the various functions of the routine 300 for compressing the characters of the input stream. It should be appreciated, however, that the routine 300 may be utilized with an input stream having characters in any order and of any length.

A table 400 is also provided in FIG. 4 illustrating the contents of the STRING variable, the CHARACTER variable, the concatenation of the STRING and CHARACTER variables, and the output of the routine 300 utilizing the input stream 20. Each row in the table 400 represents one pass through the routine 300 utilizing the input stream 20. References are also provided between the table 400 and the dictionaries 402 and 402 to represent the creation of new entries in each of the dictionaries 402 and 402. Additional details regarding this process are provided below.

The routine 300 begins at operation 302, where the first character from the input stream 20 is retrieved. The routine 300 then continues to operation 302, where the value of the STRING variable is set to the first input character. Utilizing the sample input stream 20, the value of the STRING variable is set to the character "/". From operation 304, the routine 300 continues to operation 306, where a determination is made as to whether any additional characters remain in the input data stream. If no additional characters remain in the data stream, the routine 300 branches to operation 308, where a determination is made as to whether the contents of the STRING variable are one character. If the contents of the STRING variable are one character, the routine 300 continues to operation 310, where the character contained in the STRING variable is output. Otherwise, the routine 300 branches from operation 308 to operation 312, where the code for the contents of the STRING variable are output. The routine 300 then continues from operations 310 and 312 to operation 314, where the maximum code is output. The routine 300 then continues from operation 314 to operation 316, where it ends.

If, at operation 306 it is determined that additional characters exist in the input data stream, the routine 300 continues from operation 306 to operation 318. At operation 318 the next character is read from the input data stream and assigned to the CHARACTER variable. During the first pass using the sample input data stream, the CHARACTER variable is assigned the character "W". The routine 300 then continues to operation 320, where a determination is made as to whether a code corresponding to the concatenated value of the STRING and CHARACTER variables ("/W" during the first pass) is contained in either dictionary 402 or dictionary 402. If a code corresponding to the concatenated value of the STRING and CHARACTER variables is contained in either dictionary, the routine 300 continues to operation 322, where the value of the STRING variable is updated to add the value of the CHARACTER variable. The routine 300 then returns to operation 306 described above.

If, at operation 320, it is determined that a code corresponding to the concatenated value of the STRING and CHARACTER variables is not contained in either dictionary, the routine 300 continues to operation 324. On the first pass utilizing the sample input stream 20, the routine 300 would branch to operation 324, because the value "/W" is not yet contained in either dictionary. At operation 324, a determination is made as to whether the STRING variable contains just one character. If so, the routine 300 continues from operation 324 to operation 326, where the character is output. If not, the routine 300 branches to operation 328, a code for the contents of the STRING variable is output. For instance, on the first pass through the sample input stream 20, the ASCII code (47) for the character "/" is output at operation 326. If the contents of the STRING variable is more than a single character, a new code is assigned to the string.

From operations 326 and 328, the routine 300 continues to operation 330, where a determination is made as to whether the concatenated value of the STRING and CHARACTER variables comprise a two character word. If the value is a two character word, the routine 300 continues to operation 332 where a new entry is added to the dictionary 402 corresponding to the concatenated value of the STRING and CHARACTER variables. In the first pass utilizing the sample input stream 20, a new entry is created in the dictionary 402 for the word "/W". If, at operation 330, it is determined that the value is not a two character word, the routine 300 continues from operation 330 to operation 334, where a new entry is added to the dictionary 402 corresponding to the concatenated value of the STRING and CHARACTER variables.

From operations 332 and 334, the routine 300 continues to operation 336, where the value of the CHARACTER variable is assigned to the STRING variable (STRING=CHARACTER). The routine 300 then returns from operation 336 to operation 306, where a determination is again made as to whether additional characters remain in the input data stream.

During the second pass utilizing the sample input data stream 20, the STRING variable is equal to the value of the CHARACTER variable during the previous pass ("W"). The CHARACTER variable is equal to the next character in the input stream ("E"). Because an entry does not exist in either dictionary 402 or dictionary 404 for the concatenated value ("WE"), a code for the concatenated value is added to the dictionary 402 during the second pass. Additionally, the ASCII code for the value of the STRING variable ("W") is output (87).

During the third through fifth passes, the ASCII codes for the characters "E" and "D" are output and codes for the strings "ED", "D/", and "E/" are added to the dictionary 402. During the sixth pass, the code for the string "/W" is output and a new entry is added for the string "/WE" in the dictionary 404. During pass seven, the ASCII code (69) for the character "E" is output. During passes eight and nine, the code for the string "/WE" is output and a new entry is added to the dictionary 404 for the string "/WEE". During passes ten and eleven, the code for the string "E/" is output and a new entry is created in the dictionary 404 for the string "E/W". During passes twelve and thirteen, the code for the string "WE" is output and a new entry is created in the dictionary 404 for the phrase "WEB". During pass fourteen, the ASCII code (66) for the character "B" is output and a new entry is added to the dictionary 402 for the phrase "B/". During passes fifteen through seventeen, the code for the phrase "/WE" is output. During pass eighteen, the ASCII code (84) for the character "T" is output. When there are no more characters in the input string, the routine 300 branches to operation 308, where the final character is output as described above.

Referring now to FIGS. 5 and 6, an illustrative routine 500 will be described illustrating the operation of the decompressor 35 for decompressing the compressed data stream generated by the compressor 25 and illustrated in FIG. 3. The decompressor 35 makes use of the dual dictionaries and saves a dictionary lookup operation by directly outputting characters corresponding to two character codes when such a code is encountered. A dictionary lookup must be performed to translate codes corresponding to words having three or more characters. The routine 500 will be described in conjunction with FIG. 6, which illustrates the contents of a table 602, utilized to store the dictionary information during decompression.

As shown in FIG. 6, a table 602 is utilized by the decompressor 35 to store the dictionary information. In particular, the table 602 includes a column 604 for storing the code. The table 602 also includes a column 604 for storing a flag that indicates whether the code corresponds to a word having two characters or to a word having three or more characters. If a code is encountered that corresponds to a word having only two characters, then the characters can be output directly without an additional decoding. If a code is encountered that corresponds to a word having three or more characters, the table 602 must be utilized to decode the code until an entry is encountered that corresponds to a word having only two characters. Details of this process will be discussed in greater detail below.

As with the compressor 25, the decompressor 35 utilizes several variables. In particular, a variable OLD CODE is utilized to store the previous code in the input data stream. A variable NEW CODE is utilized to store the previous code. A variable called STRING is utilized to store the translated character value of the NEW CODE variable. A variable called CHARACTER is utilized to store the first character in the STRING variable. The table 600 illustrates the contents of each of these variables and the output stream during the decompression of the input data stream 27. The routine 500 will now be described with reference to FIG. 6 and the sample input data stream 27.

The routine 500 begins at operation 502, where the first character is read from the input data stream 27. The routine 500 then continues to operation 504, where the character is output. The routine 500 then continues to operation 506, where the STRING variable is set equal to the first read character. The routine 500 then continues to operation 508, where a determination is made as to whether additional data remains in the input stream. If no additional data remains, the routine 500 branches to operation 509, where it ends. If additional characters remain to be processed, the routine 500 continues to operation 510.

At operation 510, the next code or character is read from the input stream. The routine 500 then continues to operation 512, where a determination is made as to whether the read data comprises a character or a code. If the read data comprises a code, the routine 500 branches to operation 526. If the read data comprises a character, the routine 500 branches to operation 514. During the first pass, the next character is the ASCII letter "W". Because the read data comprises a character, the routine 600 branches to operation 514, where the value of the character is placed on the output. The routine 500 then continues to operation 516, where a search is made of the table 602 to determine whether an entry exists for the concatenated value of the STRING variable and the character. If an entry already exists in the table, the routine 500 continues from operation 518 to operation 520. At operation 520, the concatenated value of the STRING variable and the character is assigned to the STRING variable. The routine 500 then continues from operation 520 to operation 508.

If, at operation 518, a determination is made that an entry exists in the table 602 for the concatenated value of the STRING variable and the character, the routine 500 branches to operation 522. At operation 522, a new entry is created in the table 602 for the code corresponding to the STRING variable and the character. Additionally, the flag in the column 606 is set or not set depending upon whether the new code corresponds to a word having two characters or three or more characters. In the illustrative table 602 shown in FIG. 5, the flag is not set (0) for two character words and is set (1) for three or more character words. From operation 522, the routine 500 continues to operation 524, where the value of the STRING variable is set equal to the character.

If, at operation 512, it is determined that a code was read from the input stream, the routine 500 branches to operation 526. At operation 526, a search is made of the table 602 for the read code. The routine 500 then continues to operation 528, where the code is decoded. If the code corresponds to a word having only two characters (as indicated by the flag in the column 606 for the code), then no decoding operation is required. The characters to be output can be determined directly from the input code. If the code corresponds to a word having three or more characters, then the code must be decoded by stepping through the table 602 until a code is encountered corresponding to a word having only two characters. During this process a decoding string is created for each of the words encountered in the decoding process.

From operation 528, the routine 500 continues to operation 530, where the value of the CHARACTER variable is set to the value of the first character in the decoding string.

The routine 500 then continues to operation 532, where the decoding string is output. From operation 532, the routine 500 continues to operation 534 where a new item is created in the table 602 for the concatenated value of the STRING variable and the CHARACTER variable. The routine 500 then continues to operation 536, where the value of the STRING variable is set equal to the value of the decoding string.

From operations 520, 524, and 536 the routine 500 returns to operation 508, where a determination is made as to whether additional input data remains to be processed. It should be appreciated that the application of the process illustrated in FIG. 5 results in an output stream equivalent to the input stream 20 to the routine 400 described above.

According to other aspects of the method, a simplified mechanism is provided for generating a memory address for entries in the table 602. According to this aspect, a memory address may be formed directly from the character and code comprising the input word. In this embodiment, the character is appended to the code and the result is utilized to directly access the contents of the table 602.

It will be appreciated that embodiments of the present invention provide methods, systems, apparatus, and computer-readable medium for compressing and decompressing data utilizing multiple dictionaries. Although the invention has been described in language specific to computer structural features, methodological acts and by computer readable media, it is to be understood that the invention defined in the appended claims is not necessarily limited to the specific structures, acts or media described. Therefore, the specific structural features, acts and mediums are disclosed as exemplary embodiments implementing the claimed invention.

The various embodiments described above are provided by way of illustration only and should not be construed to limit the invention. Those skilled in the art will readily recognize various modifications and changes that may be made to the present invention without following the example embodiments and applications illustrated and described herein, and without departing from the true spirit and scope of the present invention, which is set forth in the following claims.

What is claimed is:

1. A method for compressing an input data stream, the method comprising:
    reading a string and a character from the input data stream;
    determining if a code corresponding to the string plus the character is contained in a first dictionary or a second dictionary;
    in response to determining that a code corresponding to the string plus the character is in the first or second dictionaries, adding a next input character from the input data stream to the string and repeating the determining operation;
    in response to determining that a code corresponding to the string is not in the first or second dictionaries,
        determining whether the string contains only one character,
        outputting the character if the string contains only one character, and
        outputting a new code for the string if the string contains more than one character,
        determining whether the string plus the next input character comprises a two character word,
        adding a new code for the string plus the next input character to the first dictionary in response to determining that the string plus the character comprises a two character word,
        adding a new code for the string plus the character to the second dictionary in response to determining that the string plus the character comprises a word having more than two characters, and
        setting the string equal to the character.

2. The method of claim 1, wherein the first dictionary is utilized to store codes corresponding only to two character words.

3. The method of claim 2, wherein the second dictionary is utilized to store only codes corresponding only to words having three or more characters.

4. The method of claim 3, further comprising:
    determining whether additional characters remain in the input data stream;
    in response to determining that no additional characters remain in the input data stream, determining if the string contains only one character;
    in response to determining that the string contains only one character, outputting the character; and
    in response to determining that the string contains more than one character, outputting a code for the string.

5. The method of claim 4, wherein a memory address of each location in the first and second dictionaries may be formed directly from the string code and the character.

6. The method of claim 5, wherein the memory address is formed by appending the string code after the character.

7. A computer-controlled apparatus capable of performing the method of claim 1.

8. A computer-readable medium having computer-readable instructions stored thereon which, when executed by a computer, cause the computer to perform the method of claim 1.

9. A field-programmable gate array capable of performing the method of claim 1.

10. A method for decompressing an input data stream, the method comprising:
    reading input from a compressed data stream;
    determining whether the read input comprises a code corresponding to a two character word;
    in response to determining that the read input comprises a code corresponding to a two character word, directly outputting the two characters of the word as an output string without performing any additional lookup operations;
    in response to determining that the read input does not comprise a code corresponding to a two character word, determining whether the read input comprises a code corresponding to a word having three or more characters; and
    in response to determining that the read input comprises a code corresponding to a word having three or more characters, performing one or more additional lookup operations to identify an output string, and outputting the string.

11. The method of claim 10, further comprising:
    determining whether the input comprises a character;
    if the input comprises a character, determining whether a string and the character together comprise a two character word; and
    in response to determining that the string and the character comprise a two character word, adding a new code for the string and the character to a table with an indication that the new code is for a two character word.

12. The method of claim 11, further comprising:

in response to determining that the string and the character do not comprise a two character word, adding a code for the string and character to the table with an indication that the new code is for a word having more than two characters.

13. The method of claim 12, wherein the indication comprises a flag in the table.

14. The method of claim 13, wherein the flag specifies for each code in the table whether the code corresponds to a two character word or a word having more than two characters.

15. The method of claim 14, wherein a memory address of each location in the table may be formed directly from the input word.

16. The method of claim 15, wherein the address is formed by appending the character to the code.

17. A computer-controlled apparatus capable of performing the method of claim 10.

18. A computer-readable medium having computer-readable instructions stored thereon which, when executed by a computer, cause the computer to perform the method of claim 10.

19. A field-programmable gate array capable of performing the method of claim 10.

* * * * *

UNITED STATES PATENT AND TRADEMARK OFFICE
CERTIFICATE OF CORRECTION

PATENT NO. : 7,167,115 B1
APPLICATION NO. : 11/212158
DATED : January 23, 2007
INVENTOR(S) : Umasankar Mondal and Dingguo Zou It is certified that error appears in the above-identified patent and that said Letters Patent is hereby corrected as shown below:

Column 7

Line 36, "402" should read --404--.

Line 40, "404" should read --406--.

Line 56, the second "402" should read --404--.

Line 57, the second "402" should read --404--.

Line 61, "302" should read --304--.

Column 8

Beginning on Line 23, "either dictionary 402 or dictionary 402" should read --either dictionary 402 or dictionary 404--.

Beginning in Line 59, "where a new entry is added to the dictionary 402" should read --where a new entry is added to the dictionary 404--.

Column 9

Line 52, "604" should read --606--.

UNITED STATES PATENT AND TRADEMARK OFFICE
CERTIFICATE OF CORRECTION

PATENT NO. : 7,167,115 B1
APPLICATION NO. : 11/212158
DATED : January 23, 2007
INVENTOR(S) : Umasankar Mondal and Dingguo Zou

It is certified that error appears in the above-identified patent and that said Letters Patent is hereby corrected as shown below:

Column 10

Line 47, "FIG. 5," should read --FIG. 6,--.

Signed and Sealed this

Tenth Day of April, 2007

JON W. DUDAS
*Director of the United States Patent and Trademark Office*